(12) United States Patent
Takaku et al.

(10) Patent No.: US 11,316,078 B2
(45) Date of Patent: Apr. 26, 2022

(54) OPTICAL WAVELENGTH CONVERTER AND COMPOSITE OPTICAL DEVICE

(71) Applicant: NGK SPARK PLUG CO., LTD., Nagoya (JP)

(72) Inventors: Syohei Takaku, Nagoya (JP); Yusuke Katsu, Nagoya (JP); Tsuneyuki Ito, Nagoya (JP); Yuki Shimura, Nagoya (JP); Shinji Ban, Nagoya (JP); Takeshi Mitsuoka, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 133 days.

(21) Appl. No.: 16/651,434

(22) PCT Filed: Sep. 10, 2018

(86) PCT No.: PCT/JP2018/033392
§ 371 (c)(1),
(2) Date: Mar. 27, 2020

(87) PCT Pub. No.: WO2019/065175
PCT Pub. Date: Apr. 4, 2019

(65) Prior Publication Data
US 2020/0303597 A1    Sep. 24, 2020

(30) Foreign Application Priority Data

Sep. 29, 2017  (JP) .............................. JP2017-191058

(51) Int. Cl.
*H01L 33/50* (2010.01)
*F21V 29/502* (2015.01)
(Continued)

(52) U.S. Cl.
CPC .......... *H01L 33/502* (2013.01); *C04B 35/117* (2013.01); *F21V 7/30* (2018.02);
(Continued)

(58) Field of Classification Search
CPC ................. F21V 29/502; C04B 35/117; C04B 2235/3224; C09K 11/7774
See application file for complete search history.

(56) References Cited

U.S. PATENT DOCUMENTS

| 2013/0001619 A1 | 1/2013 | Shibamoto et al. |
| 2013/0257264 A1 | 10/2013 | Tamaki et al. |

(Continued)

FOREIGN PATENT DOCUMENTS

| CN | 102576794 A | 7/2012 |
| CN | 103367611 A | 10/2013 |

(Continued)

OTHER PUBLICATIONS

Translation for WO 2018/209925, Nov. 22, 2018.*

(Continued)

*Primary Examiner* — C Melissa Koslow
(74) *Attorney, Agent, or Firm* — Sughrue Mion, PLLC

(57) ABSTRACT

An optical wavelength converter (1) is configured such that an optical wavelength conversion member (9) is bonded to a heat dissipation member (13) having superior heat dissipation property. Thus, heat generated by light incident on the optical wavelength conversion member (9) can be efficiently dissipated. Therefore, even when high-energy light is incident on the optical wavelength converter, temperature quenching is less likely to occur, and thus high fluorescence intensity can be maintained. An intermediate film (21) is disposed between a reflective film (19) and a bonding portion (15). The presence of the intermediate film (21) improves the adhesion between the reflective film (19) and the bonding portion (15), thereby enhancing the heat dissipation from the optical wavelength conversion member (9) to the heat dissipation member (13). Thus, the temperature (Continued)

quenching of the optical wavelength conversion member (9) can be prevented, thereby enhancing fluorescence intensity.

5 Claims, 3 Drawing Sheets

(51) Int. Cl.
  *F21V 7/30* (2018.01)
  *F21V 9/32* (2018.01)
  *C04B 35/117* (2006.01)
  *F21V 13/08* (2006.01)
  *F21V 8/00* (2006.01)
  *F21V 29/90* (2015.01)

(52) U.S. Cl.
  CPC .............. *F21V 9/32* (2018.02); *F21V 13/08* (2013.01); *F21V 29/502* (2015.01); *F21V 29/90* (2015.01); *G02B 6/0031* (2013.01); *C04B 2235/3224* (2013.01); *C04B 2235/3229* (2013.01)

(56) References Cited

U.S. PATENT DOCUMENTS

| | | |
|---|---|---|
| 2015/0159836 A1 | 6/2015 | Tamaki et al. |
| 2015/0316233 A1 | 11/2015 | Kawamata et al. |
| 2017/0102135 A1 | 4/2017 | Kawamata et al. |

FOREIGN PATENT DOCUMENTS

| | | | |
|---|---|---|---|
| JP | 2013-250318 A | | 12/2013 |
| JP | WO2014/061497 A1 | | 4/2014 |
| JP | 2014-186882 A | | 10/2014 |
| JP | 2015-119046 | * | 6/2015 |
| JP | 2015-119046 A | | 6/2015 |
| JP | 2017-90625 A | | 5/2017 |
| JP | 2017-116719 A | | 6/2017 |
| KR | 10-2017-0084590 A | | 7/2017 |
| TW | 200810157 A | | 2/2008 |
| WO | 20014/021027 A1 | | 2/2014 |
| WO | WO 2018/209925 | * | 11/2018 |

OTHER PUBLICATIONS

Office Action dated Jun. 7, 2021, issued by the State Intellectual Property Office of P.R. China in Machine counterpart Chinese Patent Application No. 201880061679.1.
International Search Report dated Nov. 27, 2018 by the International Searching Authority in counterpart International Patent Application No. PCT/JP2018/033392.
Office Action dated Oct. 31, 2019 by the Taiwan Patent Office in counterpart Taiwan Patent Application No. 107134142.
Communication dated Jun. 9, 2021, issued by the Korean Intellectual Property Office in Korean Application No. 10-2020-7008506.
Communication dated May 7, 2021, from the European Patent Office in European Application No. 18862586.7.
Office Action dated Dec. 14, 2021 by the Korean Intellectual Property Office in counterpart Korean Machine Patent Application No. 10-2020-7008506.
Communication dated Nov. 24, 2021 by the Japanese Patent Office in corresponding Japanese Patent Application No. 2017-191058.

* cited by examiner

OPTICAL WAVELENGTH CONVERTER AND COMPOSITE OPTICAL DEVICE

CROSS REFERENCE TO RELATED APPLICATIONS

This application is a National Stage of International Application No. PCT/JP2018/033392 filed Sep. 10, 2018, claiming priority based on Japanese Patent Application No. 2017-191058 filed Sep. 29, 2017.

TECHNICAL FIELD

The present disclosure relates to an optical wavelength converter and a composite optical device, each of which can convert light wavelength and is used for, for example, optical wavelength conversion apparatuses, fluorescent materials, lighting apparatuses, and video apparatuses.

BACKGROUND ART

A head lamp, a lighting apparatus, or a similar apparatus generally includes a device for obtaining white light through wavelength conversion, by means of a fluorescent body (i.e., an optical wavelength conversion member), of blue light emitted from a light-emitting diode (LED) or a Laser diode (LD).

Hitherto, the matrix or material of the fluorescent body (or a phosphor) is, for example, a resin material or a glass material. In accordance with a trend for using a high-output light source in recent years, the phosphor is required to have higher durability. Thus, ceramic phosphors have received attention.

In recent years, an apparatus including the aforementioned fluorescent body has been proposed wherein the wavelength of light incident in a predetermined direction (e.g., light incident from the upper surface) is converted, and wavelength-converted light (i.e., fluorescence) is reflected by a reflective film in the opposite direction and emitted to the outside of the apparatus (see, for example, Patent Document 1).

PRIOR ART DOCUMENT

Patent Document

Patent Document 1: International Patent Publication WO 2014/021027

SUMMARY OF THE INVENTION

Problem to be Solved by the Invention

However, the aforementioned conventional technique cannot achieve a sufficient heat dissipation effect, despite heat dissipation by a heat dissipation member bonded to a fluorescent body serving as an optical wavelength conversion member. Thus, an increase in the temperature of the fluorescent body may cause temperature quenching, resulting in a decrease in the intensity of emitted light (i.e., emission intensity or fluorescence intensity).

Although the fluorescent body used in the aforementioned conventional technique is formed of, for example, a single-component YAG phosphor, the technique cannot achieve satisfactory optical wavelength conversion characteristics (e.g., high fluorescence intensity and reduced color unevenness).

In view of the foregoing, an object of the present disclosure is to provide an optical wavelength converter and a composite optical device, each of which exhibits excellent heat dissipation property and superior optical wavelength conversion characteristics.

Means for Solving the Problem (1) A first aspect of the present disclosure relates to an optical wavelength converter comprising an optical wavelength conversion member for converting the wavelength of incident light; a heat dissipation member having heat dissipation property superior to that of the optical wavelength conversion member; and a bonding portion for bonding the optical wavelength conversion member to the heat dissipation member.

In this optical wavelength converter, the optical wavelength conversion member has an antireflective film provided on a first surface on which the light, is incident so as to prevent light reflection, a reflective film provided on a second surface opposite the first surface so as to reflect light, and an intermediate film disposed between the reflective film and the bonding portion so as to improve adhesion between the reflective film and the bonding portion.

The optical wavelength conversion member is a ceramic fluorescent body formed of a ceramic sintered body having a fluorescent phase containing fluorescent crystal grains as a main component and a translucent phase containing translucent crystal grains as a main component.

The crystal grains of the translucent phase have a composition of $Al_2O_3$, and the crystal grains of the fluorescent phase have a composition represented by the formula $A_3B_5O_{12}$:Ce, wherein each of the elements A and B is at least one element selected from the following element groups.

A: Sc, Y, and lanthanoids (excluding Ce)
(note: Gd may be further contained as the element A)
B: Al (note: Ga may be further contained as the element B)

According to the first aspect, the optical wavelength conversion member is bonded to the heat dissipation member having superior heat dissipation property (i.e., high thermal conductivity), and thus heat generated by light (e.g., laser light) incident on the optical wavelength conversion member can be efficiently dissipated. Therefore, even when high-energy light is incident (e.g., high-output laser light is incident) on the optical wavelength converter, temperature quenching is less likely to occur, and thus high fluorescence intensity can be maintained.

The heat dissipation renter may be formed of a material such as copper (Cu), aluminum (Al), or aluminum nitride (AlN). In particular, the heat dissipation member is preferably formed of copper. The heat dissipation member preferably has a thickness of 0.1 mm to 4 mm.

In the first aspect, the bonding portion is disposed between the heat dissipation member and the intermediate film and thus the heat dissipation member can be appropriately bonded to the reflective film.

The bonding portion may be formed of a material such as solder, a metal brazing material, a silver paste, or an inorganic binder. Solder is preferably used, for improving thermal conductivity. The bonding portion preferably has a thickness of 0.01 μm to 100 μm.

In the first aspect, the optical wavelength conversion member has the reflective film on the second surface, and thus fluorescence generated in the interior of the optical wavelength conversion member can be efficiently reflected.

Therefore, light that would otherwise transmit through the optical wavelength conversion member can be reflected and efficiently emitted in an intended direction (i.e., to the outside of the member). Consequently, the optical wavelength conversion member exhibits enhanced emission intensity.

The reflective film may be formed of a material such as aluminum, niobium oxide, titanium oxide, lanthanum oxide, tantalum oxide, yttrium oxide, gadolinium oxide, tungsten oxide, hafnium oxide, aluminum oxide, or silicon nitride. The reflective film may have a single-layer structure or a multilayer structure. The reflective film preferably has a thickness or 0.1 µm to 1 µm.

In the first aspect, the optical wavelength conversion member has the anti reflective film (e.g., AR coating) on the first surface, and thus light reflection at the first surface can be reduced. Therefore, a large amount of light can be incident on the optical wavelength conversion member, and incident light can be efficiently absorbed by the crystal grains of the fluorescent phase. Since the antireflective film is present, the light generated in the interior of the optical wavelength conversion member can be efficiently extracted to the outside of the member. Consequently, the optical wavelength conversion member exhibits enhanced emission intensity.

The antireflective film may be formed of a material such as niobium oxide, titanium oxide, tantalum oxide, aluminum oxide, zirconium oxide, silicon oxide, aluminum nitride, silicon nitride, or magnesium fluoride. The antireflective film may have a single-layer structure or a multilayer structure. The antireflective film preferably has a thickness of 0.01 µm to 1 µm.

In the first aspect, the intermediate film (e.g., Ni layer) is disposed between the reflective film (e.g., Al layer) and the bonding portion (e.g., solder layer) for improving the adhesion between the reflective film and the bonding portion. The presence of the intermediate film improves the adhesion between the reflective film and the bonding portion, thereby effectively enhancing the heat dissipation from the optical wavelength conversion member on the reflective film side to the heat dissipation member on the bonding portion side. Thus, the temperature quenching of the optical wavelength conversion member can be prevented, thereby advantageously enhancing fluorescence intensity.

The intermediate film may be formed of a material such as gold (Au), silver (Ag), or nickel (Ni). The intermediate film may have a single-layer structure or a multilayer structure. The intermediate film preferably has a thickness of 0.01 µm to 1 µm.

In the first aspect, the optical wavelength conversion member is basically formed of a ceramic sintered body having a fluorescent phase containing fluorescent crystal grains as a main component and a translucent phase containing translucent crystal grains as a main component. The ceramic sintered body has a garnet structure represented by $A_3B_5O_{12}$:Ce wherein each of the elements A and B is at least one element selected from the aforementioned element groups.

Since the optical wavelength conversion member is formed of the aforementioned ceramic sintered body, light scattering can occur at the interface between the fluorescent phase and the translucent phase, thereby reducing the angle dependence of the color of light, leading to an improvement in color uniformity (i.e., reduced color unevenness).

Since the optical wavelength conversion member is formed of the aforementioned ceramic sintered body, the optical wavelength conversion member exhibits high thermal conductivity. Thus, heat generated in the optical wavelength conversion member by light (e.g., laser light) incident on the member can be efficiently dissipated to the heat dissipation member. Therefore, even when, for example, high-output laser light is incident on the optical wavelength conversion member, superior fluorescence characteristics can be maintained.

When the optical wavelength conversion member is formed of a single component as in the case or a conventional optical wavelength converter, light scattering does not occur, and the angle dependence of the color of light increases, resulting in light color unevenness. In the case where the fluorescent body is formed of a resin, the fluorescent body exhibits low thermal conductivity, resulting in no heat dissipation and occurrence of temperature quenching.

In contrast, in the first aspect, the optical wavelength conversion member is formed of the aforementioned ceramic sintered body having a garnet structure, and thus occurrence of color unevenness or temperature quenching can be prevented.

Thus, in the first aspect, the aforementioned configuration achieves satisfactory optical wavelength conversion characteristics (e.g., high fluorescence intensity and reduced color unevenness). For example, this configuration enables effective conversion of blue light into visible light.

The amount of the compound having a composition represented by the formula $A_3B_5O_{12}$:Ce (i.e., the substance forming crystal grains of the fluorescent phase) is preferably 3 vol. % to 70 vol. % relative to the entire ceramic sintered body. In the compound having a composition represented by the formula $A_3B_5O_{12}$:Ce, the Ce content (Ce concentration) is preferably 0.1 mol % to 1.0 mol % relative to the element A of the compound.

In the case where the compound having a composition represented by the formula $A_3B_5O_{12}$:Ce contains Gd, the Gd content (Gd concentration) is preferably 30 mol % or less relative to the element A of the compound. In the case where the compound contains Ga, the Ga content (Ga concentration) is preferably 30 mol % or less relative to the element B of the compound.

(2) In a second aspect of the present disclosure, the optical wavelength conversion member may have a thickness of 100 µm to 400 µm as measured from the first surface to the second surface.

A thickness of the optical wavelength conversion member of less than 100 µm may cause a decrease in the amount of a fluorescent component in a transmission direction, resulting in insufficient fluorescence; i.e., low fluorescence intensity. Meanwhile, a thickness of the optical wavelength conversion member of more than 400 µm cause an increase in the amount of light absorbed in the interior of the optical wavelength conversion member, leading to a decrease in the amount of emitted light, resulting in impaired fluorescence characteristics.

Thus, when the thickness is adjusted to fall within the aforementioned range, superior fluorescence characteristics (i.e., high fluorescence intensity) and excellent heat dissipation property are achieved.

(3) In a third aspect of the present disclosure, the first surface of the optical wavelength conversion member may have an average surface roughness (arithmetic average roughness Sa) satisfying the following relation: 0.001 µm<Sa<0.5 µm.

When the first surface of the optical wavelength conversion member has an average surface roughness Sa of less than 0.001 µm, specular reflection may occur at the first surface, leading to inefficient incidence of light, resulting in impaired fluorescence characteristics (e.g., low fluorescence intensity). Meanwhile, when the first surface has an average surface roughness Sa of more than 0.5 µm, diffused reflection may occur at the first surface, leading to inefficient extraction of emitted light, resulting in impaired fluorescence characteristics (e.g., low fluorescence intensity).

Thus, superior fluorescence characteristics can be achieved by adjusting the average surface roughness Sa to fall within the aforementioned range.

The average surface roughness (arithmetic average roughness Sa) is a parameter prescribed by ISO 25178.

(4) In a fourth aspect of the present disclosure, the first surface of the optical wavelength conversion member may have a surface roughness (arithmetic average roughness Ra) satisfying the following relation: $0.001 \text{ µm} < Ra < 0.4 \text{ µm}$.

When the first surface of the optical wavelength conversion member has a surface roughness Ra of less than 0.001 µm, specular reflection may occur at the first surface, leading to inefficient incidence of light, resulting in impaired fluorescence characteristics (e.g., low fluorescence intensity). Meanwhile, when the first surface has a surface roughness Ra of wore than 0.4 µm, diffused reflection may occur at the first surface, leading to inefficient extraction of emitted light, resulting in impaired fluorescence characteristics (e.g., low fluorescence intensity).

Thus, superior fluorescence characteristics can be achieved by adjusting the surface roughness Ra to fall within the aforementioned range.

The surface roughness (arithmetic average roughness Ra) is a parameter prescribed by JIS B 0601:2013.

(5) In a fifth aspect of the present disclosure, a relative refractive index difference $\Delta n$ ($=(n1-n2)/n1$) of 0.3 or less may be achieved, wherein n1 represents the refractive index of the optical wavelength conversion member, and n2 represents the refractive index of the antireflective film.

When the relative refractive index difference $\Delta n$ between the refractive index n1 of the optical wavelength conversion member and the refractive index n2 of the antireflective film (i.e., $(n1-n2)/n1$) is large, reflectance increases at the interface between the optical wavelength conversion member and the antireflective film, and thus light is less likely to be incident on the optical wavelength conversion member. Consequently, fluorescence characteristics (e.g., fluorescence intensity) may be impaired.

Thus, the relative refractive index difference $\Delta n$ is preferably 0.3 or less.

(6) A sixth aspect of the present disclosure is a composite optical device comprising an optical wavelength converter of any or the first to fifth aspects.

The composite optical device according to the sixth aspect exhibits excellent heat dissipation property, and thus temperature quenching can be prevented when light is applied to the optical wavelength converter by means of, for example, a light-emitting device. The light (i.e., fluorescence) having a wavelength converted by means of the optical wavelength converter exhibits high fluorescence intensity and high color uniformity (i.e., reduced color unevenness).

Characteristic Configurations of the Present Invention Will Now be Described

The term "fluorescent phase" refers to a phase containing fluorescent crystal grains as a main component, and the term "translucent phase" refers to a phase containing as a main component, translucent crystal grains; specifically crystal grains having a composition different from that of the crystal grains of the fluorescent phase.

The term "main component" refers to any component present in a predominant amount (i.e., volume) in the aforementioned optical wavelength conversion member. For example, the fluorescent phase may contain fluorescent crystal grains in an amount of 50 vol. % or more (preferably 90 vol. % or more). For example, the translucent phase may contain translucent crystal grains in an amount of 50 vol. % or more (preferably 90 vol. % or more).

The "optical wavelength conversion member" is formed of a ceramic sintered body having the aforementioned characteristics. Crystal grains or the grain boundary therebetween may contain an unavoidable impurity. The ceramic sintered body may contain a fluorescent phase and a translucent phase (i.e., fluorescent crystal grains and translucent crystal grains) in an amount of 50 vol. % or more (preferably 90 vol. % or more) relative to the entire ceramic sintered body.

The term "$A_3B_5O_{12}$:Ce" refers to the case where a portion of the element A contained in $A_3B_5O_{12}$ is substituted by Ce through formation of a solid solution. The compound having such a structure exhibits fluorescent characteristics.

MODES FOR CARRYING OUT THE INVENTION

Next will be described embodiments of the optical wavelength converter and composite optical device of the present disclosure.

1. EMBODIMENT 1-1. Composite Optical Device

Now will be described an optical wavelength converter and a composite optical device according to the present embodiment.

Structure of Composite Optical Device

Figure 1:
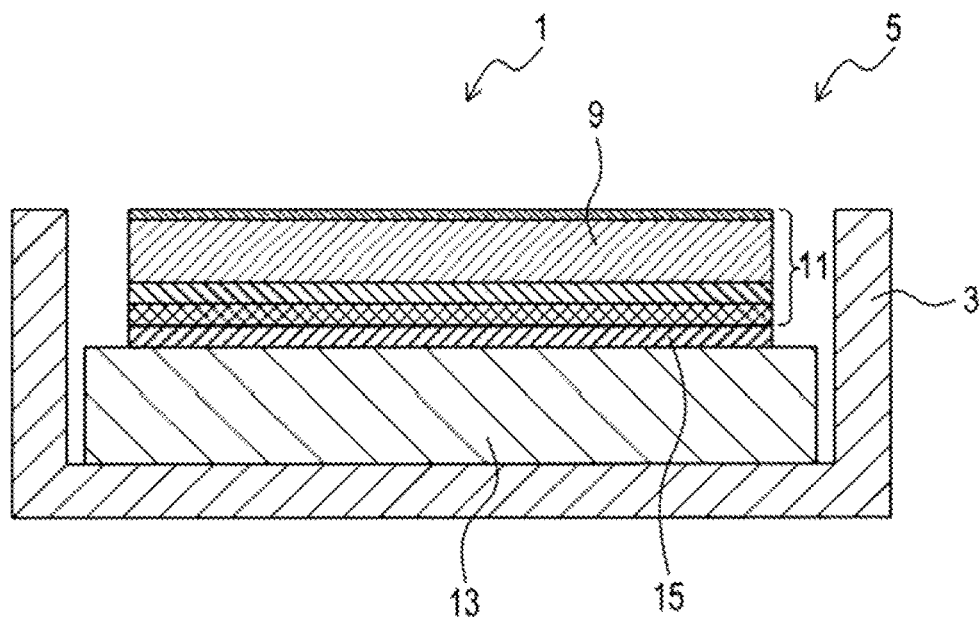
FIG. 1 is a cross-sectional view showing a cross section of a composite optical device including an optical wavelength converter according to an embodiment, the cross section being obtained by cutting the composite optical device in the thickness direction thereof.

As shown in FIG. 1, an optical wavelength converter 1 or the present embodiment is accommodated in a box-like or place-like ceramic package (container or substrate) 3 formed of, for example, alumina. Hereinafter, a combination of the package 3 and the optical wavelength converter 1 accommodated therein will be referred to as a composite optical device 5. The term "accommodated" also refers to the case where the optical wavelength converter 1 is mounted on a substrate.

Figure 2:
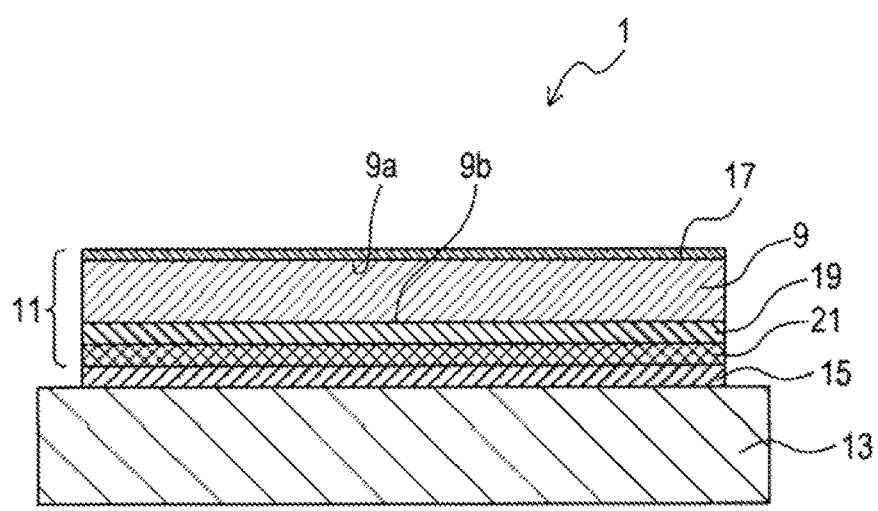
FIG. 2 is a cross-sectional view showing a cross section of the optical wavelength converter according to the embodiment, the cross section being obtained by cutting the optical wavelength converter in the thickness direction thereof.

The optical wavelength converter 1 includes a plate-like layered unit 11 including an optical wavelength conversion member 9, and a plate-like heat dissipation member 13, wherein the layered unit 11 is bonded to the dissipation member 13 by means of a layer-form bonding portion 15. Thus, as shown in FIG. 2, in the optical wavelength converter 1, an antireflective film 17, the optical wavelength conversion member 9, a reflective film 19, an intermediate film 21, the bonding portion 15, and the heat dissipation member 13 are disposed (specifically, stacked) such that they are arranged in this order from the light incident side (the upper side in FIG. 2).

As described below, light is applied to the optical wavelength converter 1 from the upper or lateral side in FIG. 2. For example, laser light is applied to the surface (upper surface: first surface 9a) of the antireflective film 17 from, for example, a laser light-emitting device (not illustrated).

Details will be described below.

The antireflective film 17 has a light reflectance lower than that of the optical wavelength conversion member 9. The antireflective film 17 is a thin film which reduces the reflection of light from the outside, to thereby efficiently take the light from the outside into the optical wavelength conversion member 9.

The anti reflective film 17 is a thin film formed of, for example, one material selected iron among niobium oxide, titanium oxide, tantalum oxide, aluminum oxide, zirconium oxide, silicon oxide, aluminum nitride, silicon nitride, and magnesium fluoride. The antireflective film 17 may have a single-layer structure formed of the aforementioned material, or a multilayer structure formed of the same material or different materials.

The antireflective film 17 has a thickness of, tor example, 0.01 μm to 1 μm. When the thickness of the antireflective film 17 is less than 0.01 μm, the antireflective effect is reduced. Meanwhile, when the thickness exceeds 1 μm, the antireflective film 17 absorbs a large amount of light, leading to light attenuation. Thus, the optical wavelength conversion member 9 exhibits reduced emission intensity.

The reflective film 19 is a thin film which reflects light transmitted through the optical wavelength conversion member 9 or fluorescence generated in the optical wavelength conversion member 9. The reflective film 19 is a thin film formed of, for example, one material selected from among aluminum, niobium oxide, titanium oxide, lanthanum oxide, tantalum oxide, yttrium oxide, gadolinium oxide, tungsten oxide, hafnium oxide, aluminum oxide, and silicon nitride. The reflective film 19 may have a single-layer structure formed of the aforementioned material, or a multilayer structure formed of the same material or different materials.

The reflective film 19 has a thickness of, for example, 0.1 μm to 1 μm. When the thickness of the reflective film 19 is less than 0.1 μm, light transmits therethrough, and the reflective effect is reduced. Meanwhile, when the thickness exceeds 1 μm, the reflective film 19 absorbs a large amount of light. Thus, the optical wavelength conversion member 9 exhibits reduced emission intensity or generates heat.

The intermediate film 21 is provided for improving the bondability of the bonding portion 15. For example, when the bonding portion 15 is formed of solder, the intermediate film 21 improves the wettability of the solder. The intermediate film 21 is a thin film (e.g., plating film) formed of, for example, one material selected from among gold, silver, and nickel. The intermediate film 21 may have a single-layer structure formed of the aforementioned material, or a multilayer structure formed of the same material or different materials.

The intermediate film 21 has a thickness of, for example, 0.01 μm to 1 μm. When the thickness of the intermediate film 21 is less than 0.01 μm, for example, wettability is lowered, and bending may fail to be achieved. Meanwhile, when the thickness exceeds 1 μm, thermal conductivity is lowered, and the heat dissipation effect may be impaired.

The bonding portion 15 is a layer provided for bonding a component (specifically, the reflective film 19) on the optical wavelength conversion member 9 side to the heat dissipation member 13 (via the intermediate film 21). The bonding portion 15 is a layer (solidified layer) formed of, for example, one material selected from among solder, a metal brazing material, a silver paste, and an inorganic binder. The bonding portion 15 may have a single-layer structure formed of the aforementioned material, or a multilayer structure formed of the same material or different materials.

The bonding portion 15 has a thickness of, for example, 0.01 μm to 100 μm. When the thickness of the bonding portion 15 is less than 0.01 μm, the bonding strength may be low, resulting in separation of the members. Meanwhile, when the thickness exceeds 100 μm, a thermal expansion difference may increase between both sides of the bonding portion in the thickness direction thereof, resulting in separation of the members.

The heat dissipation member 13 is a plate member for enhancing the heat dissipation ability of the optical wavelength conversion member 9; i.e., a plate member having a thermal conductivity higher than that of the optical wavelength conversion member 9. The heat dissipation member 13 is a plate member formed of, for example, one material selected from among copper, aluminum, and aluminum nitride. The heat dissipation member 13 may have a single-layer structure formed of the aforementioned material, or a multilayer structure formed of the same material or different materials.

The heat dissipation member 13 has a thickness of, for example, 0.1 mm to 41 mm. When the thickness of the heat dissipation member 13 is less than 0.1 mm, a sufficient heat dissipation offset may fail to be achieved. Meanwhile, when the thickness exceeds 4 mm, a thermal expansion difference may increase between both sides of the heat dissipation member in the thickness direction thereof, resulting in separation of the member.

Function of Composite Optical Device

As shown in FIG. 1, in the composite optical device 5, light emitted from a light-emitting element transmits through the antireflective film 17 and enters the translucent optical wavelength conversion member 9, and the wavelength of a portion of the light is converted in the interior of the optical wavelength conversion member 9. Thus, the optical wavelength conversion member 9 emits fluorescence having a wavelength different from that of the light emitted from the light-emitting element.

A portion of the fluorescence generated in the optical wavelength conversion member 9 is emitted through the antireflective film 17 to the outside of the composite optical device 5 (e.g., upward in FIG. 1).

The light transmitted through the optical wavelength conversion member 9 or the retraining portion of the fluorescence generated in the optical wavelength conversion member 9 is reflected by the reflective film 19 and then enters the optical wavelength conversion member 9. Thereafter, the light is emitted through the antireflective film 17 to the outside of the composite optical device 5 (e.g., upward in FIG. 1).

For example, the optical wavelength conversion member 9 converts the wavelength of blue light emitted from an LD, whereby the optical wavelength conversion member 9 as a whole omits white light to the outside of the composite optical device 5 (e.g., upward in FIG. 1).

Figure 3:
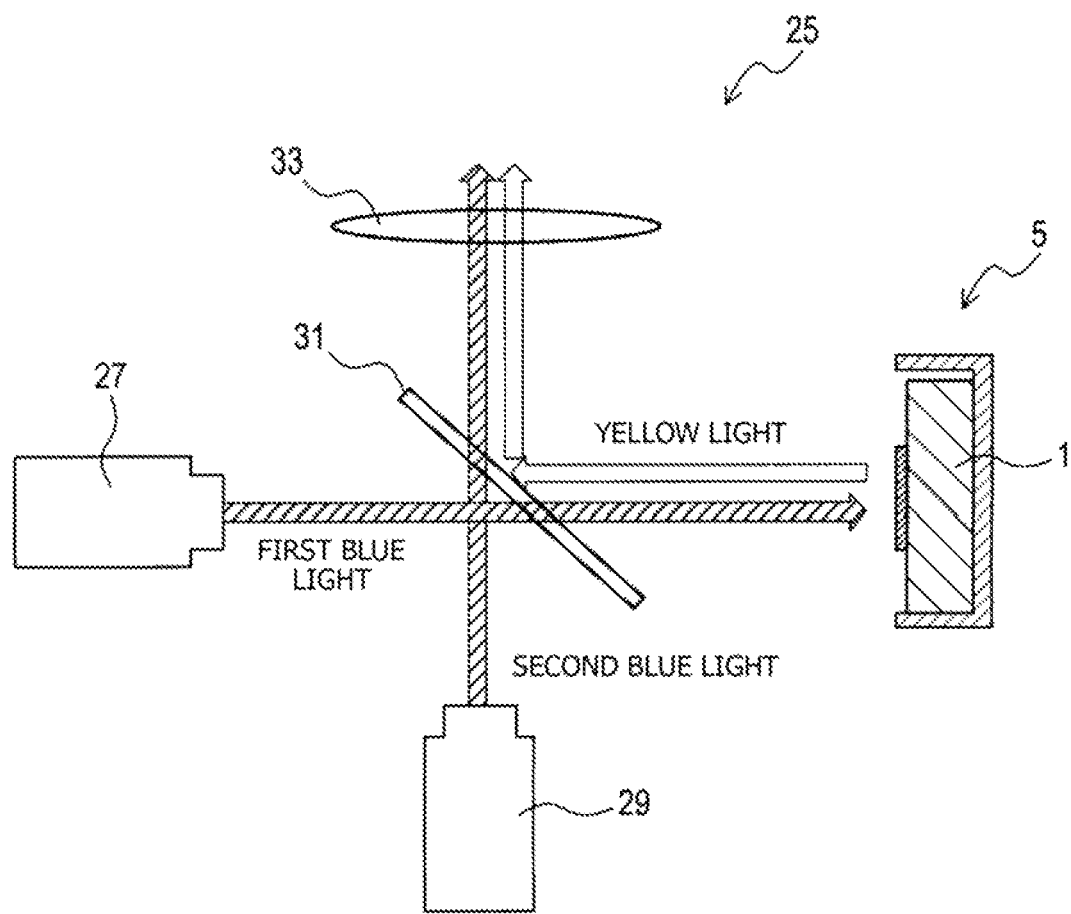
FIG. 3 is an explanatory view of a light source unit.

The aforementioned composite optical device 5 is used in, for example, a light source unit 25 shown in FIG. 3.

The light source unit 25 includes the composite optical device 5, well-known blue light lasers (i.e., a first blue light laser 27 and a second blue light laser 25) (including, for example, light-emitting elements), a dichroic mirror 31, and a lens 33.

The package 3 of the composite optical device 5 may have a light-emitting element mounting region on which a light-emitting element (e.g., LED or LD) is mounted.

In the light source unit 25, laser light (i.e., first blue light) is applied from the first blue light laser 27 to the optical wavelength converter 1 of the composite optical device 5 (rightward in FIG. 3). The wavelength of the first blue light is converted by the optical wavelength converter 1, and the resultant yellow light is reflected and outputted leftward in FIG. 3.

The yellow light is reflected by the dichroic mirror 31 inclined by 45° with respect to the horizontal direction in FIG. 3 and then applied to the lens 33.

Meanwhile, the second blue light applied from the second blue light laser 29 toward the lens 33 (upward in FIG. 3) transmits through the dichroic mirror 31 and then reaches the lens 33.

Thus, the second blue light and the yellow light applied to the lens 33 are mixed together, and the resultant white light is outputted upward in FIG. 3 through the lens 33.

[1-2. Optical Wavelength Conversion Member]

The optical wavelength conversion member 9 will now be described.

The optical wavelength conversion member 9 of the present embodiment is formed of a ceramic sintered body having a fluorescent phase containing fluorescent crystal grains (i.e., fluorescent phase grains) as a main component and a translucent phase containing translucent crystal grains (i.e., translucent phase grains) as a main component.

In the optical wavelength conversion member 9, the crystal grains of the translucent phase have a composition of $Al_2O_3$, and the crystal grains of the fluorescent phase have a composition represented by the formula $A_3B_5O_{12}$:Ce. Each of the elements A and B is at least one element selected from the following element groups:

A: Sc, Y, and lanthanoids (except for Ce) (note: Gd may be further contained as the element A), and B: Al (note: Ga may be further contained as the element B).

A and B of the formula $A_3B_5O_{12}$:Ce are elements (different elements) of a substance represented by the formula $A_3B_5O_{12}$:Ce (a substance having a so-called garnet structure). In the formula $A_3B_5O_{12}$:Ce, O is oxygen and Ce is cerium.

The compound represented by the formula $A_3B_5O_{12}$:Ce is, for example, a compound represented by the formula $Y_3Al_5O_{12}$:Ce (a so-called YAG compound).

In the present embodiment, the optical wavelength conversion member 9 has a thickness of 100 μm to 400 μm as measured from the first surface 9a (i.e., the upper surface of the optical wavelength conversion member 9) to the second surface 9b (i.e., the lower surface of the optical wavelength conversion member 9).

The first surface 9a of the optical wavelength conversion member 9 has an average surface roughness (arithmetic average roughness Sa) satisfying the following relation: 0.001 μm<Sa<0.5 μm. The first surface 9a of the optical wavelength conversion member 9 has a surface roughness (arithmetic average roughness Ra) satisfying the following relation: 0.001 μm<Ra<0.4 μm.

In the optical wavelength conversion member 9, the amount of the compound represented by the formula $A_3B_5O_{12}$:Ce is, for example, 3 vol. % to 70 vol. % relative to the entire ceramic sintered body.

In the compound represented by the formula $A_3B_5O_{12}$:Ce, the Ce concentration is, for example, 0.1 mol % to 1.0 mol % relative to the element A of the compound.

1-3. Refractive Index of Each Member

In the present embodiment, the relative refractive index difference Δn (=(n1−n2)/n1) (wherein n1 is the refractive index of the optical wavelength conversion member 9, and n2 is the refractive index of the antireflective film 17) is 0.3 or less.

For example, when the optical wavelength conversion member 9 and the antireflective film 17 are formed of materials shown in Table 1 below, the refractive indices are as shown in Table 1 below.

TABLE 1

| Member | Material | Refractive index |
| --- | --- | --- |
| Antireflective film | $SiO_2$ | 1.38 |
|  | $MgF_2$ | 1.46 |
| Optical wavelength conversion member | $Al_2O_3$—$A_3B_5O_{12}$:Ce | 1.76~1.85 |

When the optical wavelength conversion members 9 formed of the aforementioned materials and the antireflective films 17 formed of the aforementioned materials are selectively used in combination, the relative refractive index difference of each combination is as shown in Table 2 below.

TABLE 2

| Member | Refractive index | Relative refractive index difference |
| --- | --- | --- |
| Optical wavelength conversion member | 1.85 | 0.254 |
| Antireflective film | 1.38 | |
| Optical wavelength conversion member | 1.76 | 0.216 |
| Antireflective film | 1.38 | |
| Optical wavelength conversion member | 1.85 | 0.211 |
| Antireflective film | 1.46 | |
| Optical wavelength conversion member | 1.76 | 0.170 |
| Antireflective film | 1.46 | |

1-4. Production Method for Optical Wavelength Conversion Member and Composite Optical Device a) The steps of producing the optical wavelength conversion member 9 will now be briefly described.

Weighing of powder materials for the optical wavelength conversion member 9 (i.e., ceramic sintered body), etc. were performed (i.e., the powder materials were prepared) such that the aforementioned requirement of the embodiment are satisfied.

Subsequently, an organic solvent and a dispersant were added to the prepared powder materials, and these materials were grind-mixed in a ball mill, to thereby prepare a slurry.

Subsequently, the obtained slurry was dried and formed into granules.

The resultant granules were then subjected to press forming.

The resultant pressed compact was fired at a predetermined temperature for a predetermined period of time, to thereby produce a ceramic sintered body.

The production method for the ceramic sintered body is not limited to the aforementioned production method in which the ceramic sintered body is produced by press forming. The ceramic sintered body may be produced through firing of a sheet compact prepared through sheet forming of the slurry.

b) A production process for the composite optical device 5 will now be briefly described.

The anti reflective film 17 was formed on the first surface 9a of the optical wavelength conversion member 9 (i.e., ceramic sintered body) by means of, for example, sputtering.

The reflective film 19 was formed on the second surface 9b of the optical wavelength conversion member 9 by means of, for example, sputtering.

Subsequently, the intermediate film 21 was formed on the surface of the reflective film 19 by means of, for example, sputtering. The intermediate film 21 may be formed by means of, for example, plating instead of sputtering. Alternatively, the intermediate film 21 may be formed by thermocompression bonding of a metal sheet (e.g., a Ni sheet).

Thereafter, the layered unit 11 (specifically, the intermediate film 21) was bonded to the heat dissipation member 13 by use of a well-known bonding material such as solder (i.e., the layered unit 11 was soldered to the heat dissipation member 13). Thus, the optical wavelength converter 1 was produced.

Subsequently, the optical wavelength converter 1 was bonded to the surface of a bottom portion of the container 3 by use of, for example, an adhesive, to thereby produce the composite optical device 5.

1-5. Effects

The effects of the present embodiment will now be described.

(1) In the present embodiment, the optical wavelength conversion member 9 is bonded to the heat dissipation member 13 having superior heat dissipation property, and thus heat generated by light incident on the optical wavelength conversion member 9 can be efficiently dissipated. Therefore even when high-energy light is incident on the optical wavelength converter, temperature quenching is less likely to occur, and thus high fluorescence intensity can be maintained.

In the present embodiment, the bonding portion 15 is disposed between the heat dissipation member 13 and the intermediate film 21, and thus the heat dissipation member 13 can be appropriately bonded to the reflective film 19.

In the present embodiment, the optical wavelength conversion member 9 has the reflective film 19 on the second surface 9b, and thus fluorescence, etc. generated in the interior of the optical wavelength conversion member 9 can be efficiently reflected. Therefore, the optical wavelength conversion member 9 exhibits enhanced emission intensity.

In the present embodiment, the optical wavelength conversion member 9 has the antireflective film 17 on the first surface 9a, and thus light reflection can be reduced at the first surface 9a. Therefore, a large amount of light can be incident on the optical wavelength conversion member 9, and incident light can be efficiently absorbed by the crystal grains of the fluorescent phase. The presence of the antireflective film 17 enables light generated in the interior of the optical wavelength conversion member 9 to be efficiently extracted to the outside of the member. Consequently, the optical wavelength conversion member 9 exhibits enhanced emission intensity.

In the present embodiment, the intermediate film 21 is disposed between the reflective film 19 and the bonding portion 15. The presence of the intermediate film 21 improves the adhesion between the reflective film 19 and the bonding portion 15, thereby enhancing the heat dissipation from the optical wavelength conversion member 9 to the heat dissipation member 13. Thus, the temperature quenching of the optical wavelength conversion member 9 can be prevented, thereby enhancing fluorescence intensity.

In the present embodiment, the optical wavelength conversion member 9 is basically formed of a ceramic sintered body having a fluorescent phase containing fluorescent crystal grains as a main component and a translucent phase containing translucent crystal grains as a main component. The ceramic sintered body has a garnet structure represented by $A_3B_5O_{12}$:Ce wherein each of the elements A and B is at least one element selected from the aforementioned element groups.

Thus, light scattering can occur at the interface between the fluorescent phase and the translucent phase, thereby reducing the angle dependence of the color of light, leading to an improvement in color uniformity (i.e., reduced color unevenness).

Since the optical wavelength conversion member 9 is formed of the aforementioned ceramic sintered body, the optical wavelength conversion member 9 exhibits high thermal conductivity. Thus, neat generated in the optical wavelength conversion member 9 by light incident on the member can be efficiently dissipated to the heat dissipation member 13. Therefore, even when, for example, high-output, laser light is incident on the optical wavelength conversion member 9, superior fluorescence characteristics can be maintained.

Since the optical wavelength conversion member 9 is formed of the aforementioned ceramic sintered body having a garnet structure, occurrence of color unevenness or temperature quenching can be prevented.

Thus, in the present embodiment, the aforementioned configuration achieves satisfactory optical wavelength conversion characteristics (e.g., high fluorescence intensity and reduced color unevenness).

(2) In the present embodiment, the optical wavelength conversion member 9 has a thickness of 100 μm to 400 μm as measured from the first surface 9a to the second surface 9b. Thus, superior fluorescence characteristics (i.e., high fluorescence intensity) and excellent heat dissipation property are achieved.

(3) In the present embodiment, the first surface 9a of the optical wavelength conversion member 9 has an average surface roughness (arithmetic average roughness Sa) satisfying the following relation: 0.001 µm<Sa<0.5 µm. Thus, superior fluorescence characteristics can be achieved.

(4) In the present embodiment, the first surface 9a of the optical wavelength conversion member 9 has a surface roughness (arithmetic average roughness Ra) satisfying the following relation: 0.001 µm<Ra<0.4 µm. Thus, superior fluorescence characteristics can be achieved.

(5) In the present embodiment, the relative refractive index difference Δn (=(n1−n2)/n1) (wherein n1 is the refractive index of the optical wavelength conversion member 9, and n2 is the refractive index of the antireflective film 17) is 0.3 or less. Thus, superior fluorescence characteristics can be achieved.

2. EXAMPLES

Specific examples of the aforementioned embodiment will next be described.

There were prepared optical wavelength converter samples (samples Nos. 1 to 32) shown in Tables 3 and 4 below; i.e., optical wavelength converter samples of Examples 1 to 5.

Samples Nos. 1 to 12 and 16 to 32 fall within the scope of the present disclosure (Examples of the present disclosure), and samples Nos. 13 to 17 fall outside the scope of the present disclosure (Comparative Examples).

2-1. Evaluation of Samples

As described below, the samples were evaluated for the following items.

Laser Output Resistance

Laser light having a wavelength of 465 nm (i.e., blue LD light) was focused to a width of 0.1 mm by means of a lens, and each sample was irradiated with the focused light. The chromaticity (in X-direction) of light reflected by the sample was measured by means of a spectroradiometer (CL-500A, manufactured by KONICA MINOLTA, INC.). During the chromaticity measurement, the power density of blue LD light was gradually increased from 0 to 100 W/mm².

Occurrence of temperature quenching was determined when the chromaticity was reduced to 60% or less of that at a laser power density of 5 W/mm². The laser power density at occurrence of temperature quenching is shown in Table 4 below. For a sample exhibiting no quenching even at 100 W/mm², the laser power density at occurrence of temperature quenching is represented by ">100." A sample exhibiting no temperature quenching at 100 W/mm² or more is preferred in terms of laser output resistance.

Fluorescence Intensity

Blue LD light having a wavelength of 465 nm was focused to a width of 0.1 nm by means of a lens, and each sample was irradiated with the focused light. Light reflected by the sample was focused by means of a lens, and the emission intensity (i.e., fluorescence intensity) was measured by means of a power sensor. The sample was irradiated with the light at a power density of 40 W/mm².

The fluorescence intensity was evaluated by a value (%) relative to that (taken as 100) of a YAG:Ce single-crystal body. The fluorescence intensity is preferably 100% or more.

Color Unevenness

Color unevenness (variation in color) was evaluated through determination of a variation in chromaticity by means of an illuminometer.

Specifically, blue LD light having a wavelength of 465 nm was focused to a width of 0.5 mm by means of a lens, and each sample was irradiated with the focused light. The chromaticity of light reflected by the sample was measured by means of a spectroradiometer (CL-500A, manufactured by KONICA MINOLTA, INC.).

The light irradiation was performed on a 9 mm square region (divided into nine regions at intervals of 3 mm) at the center of the surface of each sample (i.e., the first surface of the sample). A variation in chromaticity (in X-direction) (i.e., Δx) was evaluated in each of the nine regions. The results (variation in color) are shown in Table 4 below. As used herein, the term "variation in chromaticity (Δx)" refers to the maximum deviation of chromaticity (in X-direction). The variation in chromaticity Δx is preferably less than 0.03.

The term "chromaticity" as used herein refers to a chromaticity indicated by the CIE-XYZ color system (international color system) established by the International Commission on Illumination (CIE) in 1931. Specifically, the chromaticity is indicated by the xy chromaticity diagram (so-called CIE chromaticity diagram) wherein three primary colors of light are digitized and represented in an xy coordinate space.

Surface Roughness

Before preparation of each sample, the average roughness (arithmetic average roughness Ra) and average surface roughness (arithmetic average roughness Sa) of the first surface of the optical wavelength converter were measured by means of a non-contact three-dimensional measuring apparatus Infinite Focus G5 (manufactured by Alicona Imaging).

The arithmetic average roughness Ra is a parameter prescribed by JIS B 0601:2013. The arithmetic average roughness Ra was measured at any five points of the sample. The averaged value is shown in Table 4 below. The arithmetic average roughness Sa is a three-dimensional extension of two-dimensional arithmetic average roughness Ra and is a parameter prescribed by ISO 25178. The results of measurement are shown in Table 4 below.

After preparation of each sample (i.e., after formation of the antireflective film), the average roughness (arithmetic average roughness Ra) of the first surface of the optical wavelength converter was measured by the method described below.

Figure 4A:
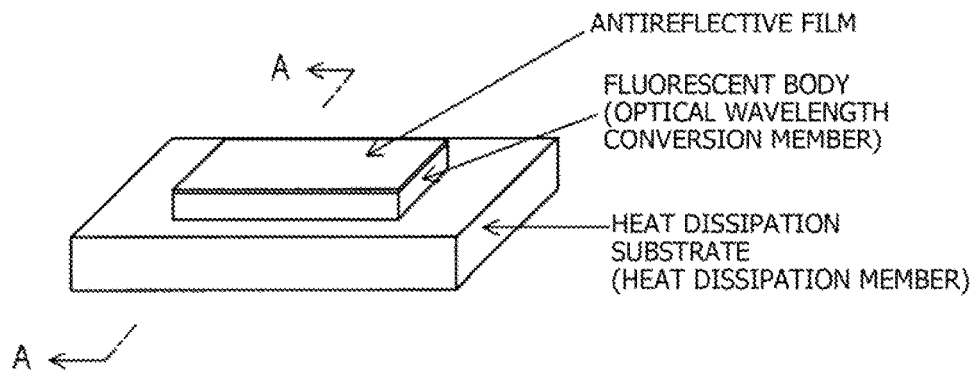
FIG. 4A is a perspective view of a sample of Example.
Figure 4B:
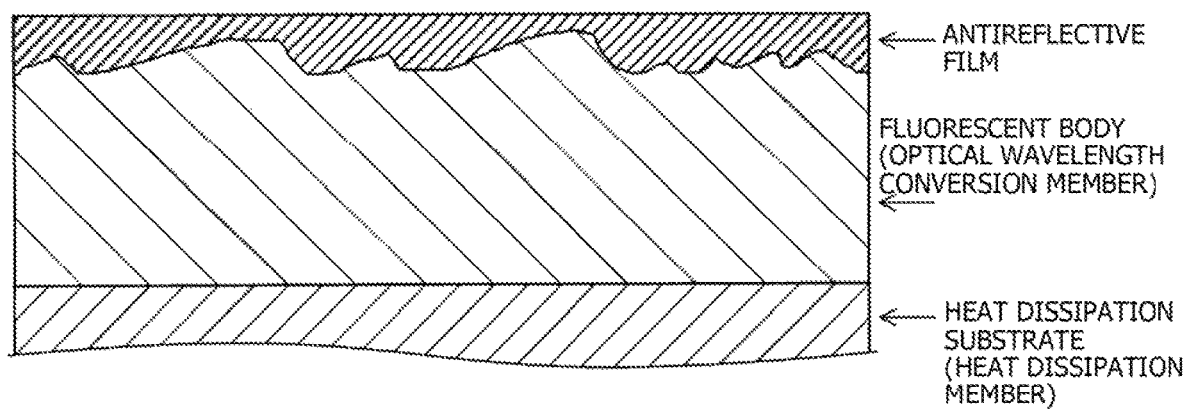
FIG. 4B is a cross-sectional view showing, on an enlarged scale, a cross section of the sample taken along line A-A of FIG. 4A.

Specifically, as shown in FIG. 4A, each sample was cut in a thickness direction so as to observe the layered structure of the sample, and images (×10,000) were obtained at any five points of the cut surface (see, for example, FIG. 4B). The images were subjected to image processing, and the arithmetic average roughness Ra of the surface of the fluorescent body (i.e., optical wavelength conversion member) was measured according to JIS B 0601:2013, to thereby calculate a five-point average. The results are shown in the "two-dimensional surface roughness Ra" column of Table 4 below.

Table 3 shows the type of the fluorescent body (optical wavelength conversion member), the types of elements A and B, the presence or absence of the antireflective film, the presence or absence of the reflective film, the presence or absence of the intermediate film, and the thickness of the fluorescent body for each sample.

For determination of the thickness of the fluorescent body, the thickness of the fluorescent body (16 mm×16 mm) was measured at its center and end portions (at four points in total) by means of a micrometer, and the thus-measured thicknesses were averaged.

2-2. Production Method for Sample and Results of Evaluation

Now will be described a production method for each sample and the results of evaluation of the sample.

Example 1

Optical wavelength converter samples (Nos. 1 to 12) were prepared under the conditions shown in, for example. Table 3 below.

Specifically, as shown in Table 3 below, $Al_2O_3$ powder (mean particle size: 0.2 μm), $Y_2O_3$ powder (mean particle size: 1.2 μm), $Lu_2O_3$ powder (mean particle size: 1.1 μm), $Sc_2O_3$ powder (mean particle size: 1.2 μm), $CeO_2$ powder (mean particle size: 1.5 μm), $Dg_2O_3$ powder (mean particle size; 1.1 μm), and $Ga_2O_3$ powder (mean particle size: 1.1 μm) were weighed in accordance with the composition of the ceramic sintered body of the optical wavelength converter of each sample (i.e., $Al_2O_3$-$A_3B_5O_{12}$:Ce).

The powder materials were weighed so that the $A_3B_5O_{12}$:Ce content of the entire ceramic sintered body was adjusted to 30 vol. %. In the case of addition of $Gd_2O_3$ or $Ga_2O_3$, the Gd or Ga content was adjusted to 15 mol % relative to the element A or B, respectively.

These powder materials were added to a ball mill together with ethanol, and these materials were grind-mixed for 16 hours. The resultant slurry was dried and formed into granules, and the granules were subjected to press forming. The resultant compact was fired in an air atmosphere at a temperature of 1,600° C. for 10 hours, to thereby prepare a ceramic sintered body (i.e., a fluorescent body serving as an optical wavelength conversion member).

The resultant fluorescent body was processed into dimensions of 16 mm×16 mm×200 μm (thickness).

Subsequently, an $SiO_2$ antireflective film (thickness: 1 μm) was formed on the upper surface (first surface) of the thus-processed fluorescent body by means of sputtering.

An Al reflective film (thickness: 1 μm) was formed on the lower surface (second surface) of the fluorescent body by means of sputtering.

Subsequently, an Ni intermediate film (thickness: 1 μm) was formed on the surface of the reflective film by means of sputtering.

Subsequently, the fluorescent body provided with the antireflective film, the reflective film, and the intermediate film was cut into a piece of 3.5 mm×3.5 mm. A heat dissipation substrate (i.e., heat dissipation member) formed of a copper plate was processed into dimensions of 12 mm×12 mm×1.5 mm (thickness).

The fluorescent body was then bonded to the heat dissipation substrate. The fluorescent body (specifically, the intermediate film) was soldered to the heat dissipation substrate by means of a bonding material (i.e., solder, such as solder containing Pb as a main component, or Pb-free solder) placed between the fluorescent body and the heat dissipation substrate. Thus, a sample of optical wavelength converter was produced.

Subsequently, the thus-produced optical wavelength converters samples (Nos. 1 to 12) falling within the scope of the present disclosure were evaluated by the aforementioned evaluation method. The results are shown in Table 4 below.

As shown in Table 4, the samples falling within the scope of the present disclosure exhibited good results; i.e., high laser output resistance (i.e., no temperature quenching at 100 $W/mm^2$), a high fluorescence intensity of 110% or more, and a small variation in color (color unevenness) of 0.028 or less.

Although not shown in Table 1, the ceramic sintered body exhibited a relative density of 99% or more in all the samples. The same results were obtained in the samples of Examples 2 to 5.

Example 2

Optical wavelength converter samples (Nos. 13 and 14) falling outside the scope of the present disclosure were prepared under the conditions shown in, for example. Table 3 below and evaluated in the sane manner as in Example 1.

The preparation method for the samples of Example 2 is basically the same as in Example 1.

However, the type of the fluorescent body is different from that in Example 1. Specifically, the fluorescent body in sample No. 13 is formed by dispersing YAG particles in a resin, and the fluorescent body in sample No. 14 is formed of a YAG single-crystal.

The results of evaluation are shown in Table 4 below. The samples of Example 2 exhibited insufficient laser output resistance (i.e., 75 $W/mm^2$ or less). This is probably due to the fact that a low thermal conductivity of the fluorescent body causes generation of a large amount of heat, resulting in occurrence of temperature quenching.

Example 3

Optical wavelength converter samples (Nos. 15 to 17) falling outside the scope of the present disclosure were prepared under the conditions shown in, for example, Table 3 below and evaluated in the sane manner as in Example 1.

The preparation method for the samples of Example 3 is basically the same as in Example 1.

However, sample No. 15 does not include an antireflective film, sample No. 16 does not include a reflective film, and sample No. 17 does not include an intermediate film.

The results of evaluation are shown in Table 4 below. In sample No. 15, no antireflective film caused insufficient absorption of incident light (i.e., blue light), resulting in low fluorescence intensity. In sample No. 16, no reflective film caused absorption of reflected light by the bonding portion, resulting in low fluorescence intensity. In sample No. 17, no intermediate film caused low solder wettability, resulting in a failure to bond the fluorescent body and the heat dissipation substrate together.

Example 4

Optical wavelength converter samples (Nos. 18 to 26) falling within the scope of the present disclosure were prepared under the conditions shown in, for example, Table 3 below and evaluated in the same manner as in Example 1.

The preparation method for the samples of Example 4 is basically the same as in Example 1. However, the thickness of the fluorescent body was varied within a range of 50 μm to 450 μm in the samples.

The results of evaluation are shown in Table 4 below. Similar to the samples of Example 1, samples Nos. 18 to 26 exhibited good results; i.e., high laser output resistance, high fluorescence intensity, and a small variation in color.

In particular, samples Nos. 19 to 25, in which the thickness of the fluorescent body was 100 μm to 400 μm, were good, because samples Nos. 15 to 25 exhibited higher fluorescence intensity as compared with samples Nos. 18 and 26 and maintained fluorescence at high laser output.

In contrast, sample No. 18, in which the thickness of the fluorescent body was less than 100 μm, exhibited low fluorescence intensity due to a decrease in the amount of a fluorescent component in a transmission direction (i.e., insufficient fluorescence). Sample No. 26, in which the thickness of the fluorescent body was more than 400 μm, exhibited low fluorescence intensity due to an increase in the amount of light absorbed in the interior of the fluorescent body, which increase was caused by the large thickness of the fluorescent body.

Example 5

Optical wavelength converter samples (Nos. 27 to 32) falling within the scope of the present disclosure were prepared under the conditions shown in, for example, Table 3 below and evaluated in the same manner as in Example 1.

The preparation method for the samples of Example 5 is basically the same as in Example 1.

However, the arithmetic average roughness Sa of the first surface of the fluorescent body was varied within a range of 0.0008 μm to 0.5 μm in the samples. The arithmetic average roughness Sa can be changed by a surface treatment (e.g., mechanical polishing or blasting) of the surface of the fluorescent body.

The results of evaluation are shown in Table 4 below. Similar to the samples of Example 1, samples Nos. 27 to 32 exhibited good results; i.e., high laser output resistance, high fluorescence intensity, and a small variation in color.

In particular, samples Nos. 28 to 31, in which the arithmetic average roughness Sa satisfied the relation: 0.001 μm<Sa<0.5 μm, and the arithmetic average roughness Ra satisfied the relation: 0.001 μm<Ra<0.4 μm, were good because samples Nos. 23 to 31 exhibited higher fluorescence intensity as compared with samples Nos. 27 and 32.

In contrast, sample No. 27, in which the arithmetic average roughness Sa of the surface of the fluorescent body was less than 0.001 μm, exhibited low fluorescence intensity due to an increase in the amount of light reflected at the surface of the fluorescent body. Similarly, sample No. 32, in which the arithmetic average roughness Sa of the surface of the fluorescent body was more than 0.5 μm, exhibited low fluorescence intensity due to inefficient extraction of emitted light caused by diffused reflection at the surface of the fluorescent body.

TABLE 3

| Example | Sample No. | Type of fluorescent body | | | | Antireflective film | Reflective film | Intermediate film | Thickness of fluorescent body (μm) |
| --- | --- | --- | --- | --- | --- | --- | --- | --- | --- |
| | | Translucent phase | Fluorescent phase | A | B | | | | |
| Example 1 | 1 | $Al_2O_3$ | $A_3B_5O_{12}$:Ce | Y, Gd | Al, Ga | Presence | Presence | Presence | 200 |
| | 2 | $Al_2O_3$ | $A_3B_5O_{12}$:Ce | Y | Al, Ga | Presence | Presence | Presence | 200 |
| | 3 | $Al_2O_3$ | $A_3B_5O_{12}$:Ce | Y, Gd | Al | Presence | Presence | Presence | 200 |
| | 4 | $Al_2O_3$ | $A_3B_5O_{12}$:Ce | Y | Al | Presence | Presence | Presence | 200 |
| | 5 | $Al_2O_3$ | $A_3B_5O_{12}$:Ce | Lu, Gd | Al, Ga | Presence | Presence | Presence | 200 |
| | 8 | $Al_2O_3$ | $A_3B_5O_{12}$:Ce | Lu | Al, Ga | Presence | Presence | Presence | 200 |
| | 7 | $Al_2O_3$ | $A_3B_5O_{12}$:Ce | Lu, Gd | Al | Presence | Presence | Presence | 200 |
| | 8 | $Al_2O_3$ | $A_3B_5O_{12}$:Ce | Lu | Al | Presence | Presence | Presence | 200 |
| | 9 | $Al_2O_3$ | $A_3B_5O_{12}$:Ce | Sc, Gd | Al, Ga | Presence | Presence | Presence | 200 |
| | 10 | $Al_2O_3$ | $A_3B_5O_{12}$:Ce | Sc | Al, Ga | Presence | Presence | Presence | 200 |
| | 11 | $Al_2O_3$ | $A_3B_5O_{12}$:Ce | Sc, Gd | Al | Presence | Presence | Presence | 200 |
| | 12 | $Al_2O_3$ | $A_3B_5O_{12}$:Ce | Sc | Al | Presence | Presence | Presence | 200 |
| Example 2 | 13 | Resin | $A_3B_5O_{12}$:Ce powder | Y, Gd | Al | Presence | Presence | Presence | 200 |
| | 14 | — | $A_3B_5O_{12}$:Ce | Y, Gd | Al | Presence | Presence | Presence | 200 |
| Example 3 | 15 | $Al_2O_3$ | $A_3B_5O_{12}$:Ce | Y, Gd | Al | Absence | Presence | Presence | 200 |
| | 16 | $Al_2O_3$ | $A_3B_5O_{12}$:Ce | Y, Gd | Al | Presence | Absence | Presence | 200 |
| | 17 | $Al_2O_3$ | $A_3B_5O_{12}$:Ce | Y, Gd | Al | Presence | Presence | Absence | 200 |
| Example 4 | 18 | $Al_2O_3$ | $A_3B_5O_{12}$:Ce | Y, Gd | Al | Presence | Presence | Presence | 50 |
| | 19 | $Al_2O_3$ | $A_3B_5O_{12}$:Ce | Y, Gd | Al | Presence | Presence | Presence | 100 |
| | 20 | $Al_2O_3$ | $A_3B_5O_{12}$:Ce | Y, Gd | Al | Presence | Presence | Presence | 150 |
| | 21 | $Al_2O_3$ | $A_3B_5O_{12}$:Ce | Y, Gd | Al | Presence | Presence | Presence | 200 |
| | 22 | $Al_2O_3$ | $A_3B_5O_{12}$:Ce | Y, Gd | Al | Presence | Presence | Presence | 250 |
| | 23 | $Al_2O_3$ | $A_3B_5O_{12}$:Ce | Y, Gd | Al | Presence | Presence | Presence | 300 |
| | 24 | $Al_2O_3$ | $A_3B_5O_{12}$:Ce | Y, Gd | Al | Presence | Presence | Presence | 350 |
| | 25 | $Al_2O_3$ | $A_3B_5O_{12}$:Ce | Y, Gd | Al | Presence | Presence | Presence | 400 |
| | 26 | $Al_2O_3$ | $A_3B_5O_{12}$:Ce | Y, Gd | Al | Presence | Presence | Presence | 450 |
| Example 5 | 27 | $Al_2O_3$ | $A_3B_5O_{12}$:Ce | Y, Gd | Al | Presence | Presence | Presence | 200 |
| | 28 | $Al_2O_3$ | $A_3B_5O_{12}$:Ce | Y, Gd | Al | Presence | Presence | Presence | 200 |
| | 29 | $Al_2O_3$ | $A_3B_5O_{12}$:Ce | Y, Gd | Al | Presence | Presence | Presence | 200 |
| | 30 | $Al_2O_3$ | $A_3B_5O_{12}$:Ce | Y, Gd | Al | Presence | Presence | Presence | 200 |
| | 31 | $Al_2O_3$ | $A_3B_5O_{12}$:Ce | Y, Gd | Al | Presence | Presence | Presence | 200 |
| | 32 | $Al_2O_3$ | $A_3B_5O_{12}$:Ce | Y, Gd | Al | Presence | Presence | Presence | 200 |

TABLE 4

| Example | Sample No. | Arithmetic average roughness Sa (μm) | Arithmetic average roughness Ra (μm) | Two-dimensional surface roughness Ra (μm) | Laser output resistance (W/mm²) | Fluorescence intensity (%) | Variation in color |
|---|---|---|---|---|---|---|---|
| Example 1 | 1 | 0.15 | 0.12 | 0.13 | >100 | 120 | 0.028 |
|  | 2 | 0.17 | 0.12 | 0.13 | >100 | 130 | 0.027 |
|  | 3 | 0.16 | 0.11 | 0.12 | >100 | 125 | 0.025 |
|  | 4 | 0.14 | 0.12 | 0.11 | >100 | 136 | 0.024 |
|  | 5 | 0.15 | 0.14 | 0.11 | >100 | 122 | 0.023 |
|  | 6 | 0.14 | 0.13 | 0.11 | >100 | 126 | 0.024 |
|  | 7 | 0.16 | 0.14 | 0.12 | >100 | 128 | 0.024 |
|  | 8 | 0.16 | 0.12 | 0.13 | >100 | 132 | 0.026 |
|  | 9 | 0.15 | 0.11 | 0.12 | >100 | 110 | 0.027 |
|  | 10 | 0.14 | 0.12 | 0.11 | >100 | 116 | 0.025 |
|  | 11 | 0.15 | 0.11 | 0.12 | >100 | 117 | 0.023 |
|  | 12 | 0.13 | 0.11 | 0.09 | >100 | 125 | 0.027 |
| Example 2 | 13 | 0.18 | 0.14 | 0.11 | 40 | 90 | 0.034 |
|  | 14 | 0.11 | 0.1 | 0.06 | 75 | 100 | 0.12 |
| Example 3 | 15 | 0.13 | 0.12 | 0.1 | >100 | 95 | 0.12 |
|  | 16 | 0.17 | 0.13 | 0.12 | >100 | 97 | 0.026 |
|  | 17 | 0.15 | 0.12 | 0.11 |  | Fail to bond |  |
| Example 4 | 18 | 0.14 | 0.12 | 0.11 | >100 | 91 | 0.028 |
|  | 19 | 0.16 | 0.13 | 0.12 | >100 | 107 | 0.029 |
|  | 20 | 0.14 | 0.12 | 0.11 | >100 | 110 | 0.027 |
|  | 21 | 0.15 | 0.12 | 0.14 | >100 | 120 | 0.028 |
|  | 22 | 0.13 | 0.12 | 0.09 | >100 | 122 | 0.027 |
|  | 23 | 0.16 | 0.12 | 0.11 | >100 | 125 | 0.025 |
|  | 24 | 0.15 | 0.13 | 0.11 | >100 | 121 | 0.024 |
|  | 25 | 0.14 | 0.13 | 0.12 | >100 | 118 | 0.023 |
|  | 26 | 0.18 | 0.13 | 0.14 | >100 | 97 | 0.021 |
| Example 5 | 27 | 0.0008 | 0.0007 | 0.0004 | >100 | 92 | 0.014 |
|  | 28 | 0.0012 | 0.0011 | 0.0011 | >100 | 104 | 0.020 |
|  | 29 | 0.01 | 0.01 | 0.01 | >100 | 115 | 0.024 |
|  | 30 | 0.10 | 0.10 | 0.07 | >100 | 120 | 0.027 |
|  | 31 | 0.40 | 0.32 | 0.35 | >100 | 105 | 0.028 |
|  | 32 | 0.50 | 0.41 | 0.42 | >100 | 94 | 0.058 |

3. OTHER EMBODIMENTS

Needless to say, the present disclosure is not limited to the aforementioned embodiment, but may be implemented in various other forms without departing from the scope of the disclosure.

(1) For example, the aforementioned optical wavelength converter or composite optical device can be used for various applications, including fluorescent bodies, optical wavelength conversion apparatuses, head lamps, lighting apparatuses, and optical apparatuses (e.g., projectors).

(2) No particular limitation is imposed on the light-emitting element used for application of light to the composite optical device. The light-emitting element may be any known element, such as LED or LD.

(3) The function of one constituent element in the above-described embodiment may be distributed to a plurality of constituent elements, or the functions of a plurality of constituent elements may be realized by one constituent element. Part of the configuration of the above-described embodiment may be omitted. Also, at least part of the configuration of the above-described embodiment may be added to or partially replace the configurations of other embodiments. Notably, all modes included in the technical idea specified by the wording of the claims are embodiments of the present disclosure.

DESCRIPTION OF REFERENCE NUMERALS

1: optical wavelength converter
5: composite optical device
9: optical wavelength conversion member
9a: first surface
9b: second surface
13: heat dissipation member
15: bonding portion
17: antireflective film
19: reflective film
21: intermediate film
25: light source unit

The invention claimed is:

1. An optical wavelength converter comprising an optical wavelength conversion member for converting the wavelength of incident light; a heat dissipation member having heat dissipation property superior to that of the optical wavelength conversion member; and a bonding portion for bonding the optical wavelength conversion member to the heat dissipation member, wherein the optical wavelength conversion member has an antireflective film provided on a first surface on which the light is incident so as to prevent light reflection, a reflective film provided on a second surface opposite the first surface so as to reflect light, and an intermediate film disposed between the reflective film and the bonding portion so as to improve adhesion between the reflective film and the bonding portion, wherein the optical wavelength conversion member is a ceramic fluorescent body formed of a ceramic sintered body having a fluorescent phase containing fluorescent crystal grains as a main component and a translucent phase containing translucent crystal grains as a main component, and wherein the crystal grains of the translucent phase have a composition of $Al_2O_3$, and the crystal grains of the fluorescent phase have a composition represented by the formula $A_3B_5O_{12}$:Ce, wherein the element A is at least one element selected from an element group consisting of Sc, Y, and lanthanoids, excluding Ce, and the element B is Al and may optionally contain Ga, and wherein the first surface of the optical wavelength conversion member has an average surface roughness (arithmetic average roughness Sa) satisfying the following relation: 0.001 μm<Sa<0.5 μm.

2. An optical wavelength converter according to claim 1, wherein the optical wavelength conversion member has a thickness of 100 to 400 μm as measured from the first surface to the second surface.

3. An optical wavelength converter according to claim 1, wherein the first surface of the optical wavelength conversion member has a surface roughness (arithmetic average roughness Ra) satisfying the following relation: 0.001 μm<Ra<0.4 μm.

4. An optical wavelength converter according to claim 1, wherein a relative refractive index difference Δn {=(n1−n2)/n1} of 0.3 or less is achieved, wherein n1 represents the refractive index of the optical wavelength conversion member, and n2 represents the refractive index of the antireflective film.

5. A composite optical device comprising an optical wavelength converter as recited in claim 1.

* * * * *